July 22, 1958 F. G. HERRING 2,844,795

TRANSISTOR REACTANCE DEVICE

Filed March 31, 1954

United States Patent Office 2,844,795

Patented July 22, 1958

2,844,795

TRANSISTOR REACTANCE DEVICE

Frederick G. Herring, Wantagh, N. Y., assignor to Hazeltine Research, Inc., Chicago, Ill., a corporation of Illinois Application March 31, 1954, Serial No. 420,224

15 Claims. (Cl. 332—16)

GENERAL

The present invention is directed to transistor reactance devices and, more particularly, to such devices which are operative to develop a controllable reactance over a wide range of frequencies which may be substantially greater than the highest frequency at which a transistor is capable of amplifying an applied signal. Such devices are particularly useful as reactance modulators for controlling or modulating the frequency of an oscillator, or for controlling the mean operating frequency of an amplifier or its pass band. For convenience the invention will be described in connection with an oscillator.

Transistors have been employed as reactance devices for controlling the frequency of oscillators operating in a frequency range below one megacycle. In some instances, however, transistors have been utilized to control the frequency of an oscillator, the upper frequency limit of which is about four megacycles. The junction transistor in particular has not proved particularly successful as an amplifier for signals above four megacycles and it heretofore has been felt that the transistor could not be successfully used above that frequency as a variable reactance device. Likewise, the sensitivity and the linearity of prior transistor reactance devices have not been as great as has been desired for some applications, and furthermore such devices have undesirably amplitude modulated the signal of the oscillator controlled thereby.

It is an object of the invention, therefore, to provide a new and improved transistor reactance device which avoids one or more of the above-mentioned disadvantages and limitations of prior such applications.

It is also an object of the invention to provide a new and improved transistor reactance device which is simple in construction and inexpensive to manufacture.

It is a further object of the invention to provide a new and improved transistor reactance device which may be employed to control the operation of an electrical device operating at frequencies well above one megacycle and which is characterized by its linearity of operation and absence of undesired amplitude modulation.

It is yet another object of the invention to provide a new and improved transistor reactance device which may be employed to control the operation of an electrical device operating at frequencies in the megacycle range and which is characterized by its high sensitivity and low-power consumption.

It is still another object of the present invention to provide a new and improved transistor reactance device for controlling the frequency of an oscillator without appreciably loading that oscillator.

A transistor reactance device which is in accordance with the present invention and operative to develop a controllable reactance over a range of frequencies which may be above the signal-amplification frequency range of a transistor comprises a body having two portions separated by an intermediate portion of semiconductive material presenting a space-charge region about the junctions of those portions. The device also includes emitter and collector connections to the aforesaid two portions and a base connection to the intermediate portion. The transistor reactance device further includes circuit means including means having a very high impedance to signals in said first-mentioned range for supplying a bias voltage in the forward direction between the emitter and base connections and including means having a very high impedance to signals in said first-mentioned range for applying a bias voltage in the reverse direction between the collector and base connections whereby the aforesaid body has a reactance at the junctions of the portions between the collector and base connections. The transistor reactance device additionally includes means for applying a control voltage between at least one of the emitter and collector connections and the base connection to develop between the collector and base connections a variation of the aforesaid reactance related to the magnitude of the control voltage. Output circuit means are coupled to the collector and emitter connections.

For a better understanding of the present invention, together with other and further objects thereof, reference is had to the following description taken in connection with the accompanying drawing, and its scope will be pointed out in the appended claims.

Referring to the drawing.

Figure 1:
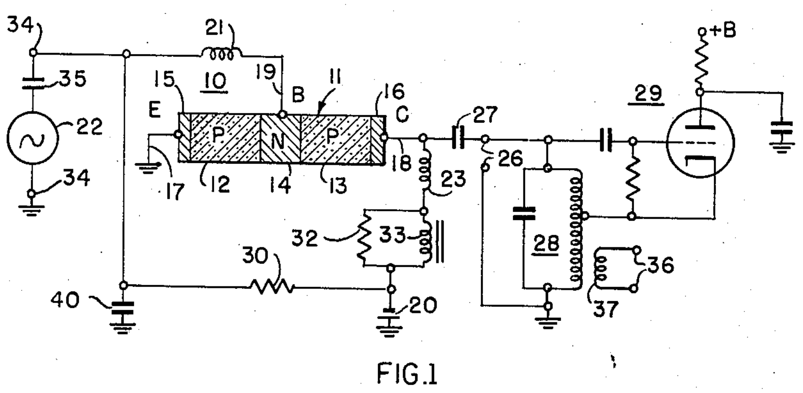
Fig. 1 is a circuit diagram of a transistor reactance device in accordance with one form of the present invention for controlling the frequency of an oscillator associated therewith.

*Description of transistor reactance device of Fig. 1*

Referring now more particularly to Fig. 1 of the drawing, there is represented a transistor reactance device 10 which is operative to develop a controllable reactance which, for some applications, may be for use by an electrical apparatus, to be described subsequently, that operates at a frequency considerably above the signal-amplification frequency range of a transistor. The device comprises a body 11 having two portions 12 and 13 separated by an intermediate portion 14 of semiconductive material such as germanium presenting a space-charge region about the junctions of the portions. The two portions 12 and 13 of the body 11 may, for example, be of semiconductive material of one electrical conductivity type while the intermediate portion 14 is of the opposite conductivity type. Accordingly, the body 11 may comprise P–N–P types of germanium or may comprise N–P–N types of that material. The transistor represented for consideration in Fig. 1 is a P–N–P junction transistor. It will be understood that the transistor may be one of the grown-junction type, the alloy-juction type, or other suitable junction-type transistors. The terminology "space-charge region about the junctions of the portions of the semiconductive body," as employed in the text and the claims, refers to the barrier region or the electrical barrier constituting a high-resistance interfacial zone or condition between contacting semiconductors of opposite conductivity types or between a semiconductor and a metallic conductor whereby current passes with ease in one direction but with relative difficulty in the other direction.

Opposite ends of the body 11 are provided with suitable means such as metallic coatings 15 and 16 for making electrical contact with the P-type layers. A similar coating or a drop of electrolyte (not shown) may form the terminal for the thinner intermediate N-type layer 14. Emitter and collector connections 17 and 18 are connected to the respective portions 12 and 13 through the respective coatings 15 and 16 while a base connection 19 is connected to the intermediate portion 14. The emitter connection is connected directly to a point of fixed potential or ground.

The transistor reactance device includes circuit means including a first means presenting a very high impedance at frequencies in a range of frequencies above the signal-amplification range of a transistor for supplying a bias voltage in the forward direction between the emitter and base connections 17 and 19, and also includes means having a very high impedance at frequencies in the first-mentioned range and preferably means having a high impedance in the audio-frequency range for applying a bias voltage in the reverse direction between the collector and base connections 18 and 19 whereby the body 11 has a reactance or capacitance at the junctions of the portions 13 and 14 between the collector and base connections. By being biased in the forward direction, is meant that the designated portions of the transistor 10 are biased in the direction which affords good current conductivity therethrough. Conversely, being biased in the reverse direction means that the designated portions of the transistor are biased in the direction of poor current conductivity. The portion of the circuit means for supplying a bias voltage in the forward direction between the emitter and base connections comprises a suitable voltage source such as a battery 20 which has its positive terminal grounded and in serially connected to the base electrode 19 through a current-limiting resistor 30 and one of the above-mentioned high impedance devices in the form of a radio-frequency choke coil 21. The values of the circuit elements just mentioned are selected to bias the transistor 10 for class A operation. A radio-frequency by-pass condenser 40 is connected between the junction of elements 21 and 30 and ground. The remaining portion of the circuit means for supplying a bias voltage in the reverse direction between the collector and base connections comprises the voltage source 20, means in the form of the parallel combination of a resistor 32 and an audio-frequency choke coil 33 which together present a high impedance to audio-frequency signals, a radio-frequency choke coil, and the collector connection 18. For some applications to be explained subsequently, the parallel combination of resistor 32 and choke coil 33 may be replaced by a resistor. It will be clear to those skilled in the art that if an N–P–N type junction transistor is employed, that the polarity of the battery 20 will be reversed from that represented in Fig. 1 in order to supply the required biases to the semiconductive body 11.

The transistor reactance device further includes means for supplying through the radio-frequency choke coil 21 a control voltage between the base connection and at least one of the emitter and collector connections, specifically, between the base connection 19 and the emitter connection 17, to develop between the collector and base connections a voltage which is representative of and has a magnitude greater than that of the control voltage and a variation of the capacitance between the portions 14 and 13 which is related to the magnitude of the control voltage. For some applications, such as in automatic-frequency-control systems, this control voltage may be a unidirectional voltage of controllable or adjustable magnitude. However, the transistor reactance device under consideration is represented as employing a periodic control voltage which is in the audio-frequncy range and is supplied by a generator 22. One terminal of the generator 22 is connected to ground through a grounded terminal 34 and the other terminal is coupled to the choke coil 21 through a coupling condenser 35 and another input terminal 34. The periodic voltage supplied by the generator 22 preferably has a maximum amplitude which is less than the magnitude of the collector bias voltage supplied by the battery 20.

The transistor reactance device additionally includes output circuit means coupled to the collector and emitter connections. This means may comprise a pair of terminals 26, 26, one of which is coupled to the collector connection 18 through a coupling condenser 27 and the other of which is grounded. The output circuit additionally includes a tuned circuit 28 such as that of a conventional Hartley-type oscillator 29 which is resonant at a frequency above the signal-amplification range of a transistor. For example, the mean operating frequency of the oscillator may be substantially 150 megacycles as compared with the maximum signal-amplification frequency of about 4 megacycles of the transistor. A frequency-modulated output signal may be taken from the output terminals 36, 36 of a winding 37 inductively coupled to the inductor of the tuned circuit 28, the units 10 and 29 together constituting a frequency-modulation system.

*Explanation of operation of transistor reactance device of Fig. 1*

Considering now the operation of the transistor reactance device of Fig. 1, a forward-direction bias is supplied by the battery 20 between the emitter and base connections 17 and 19 since the battery has its positive terminal connected to the emitter connection and its negative terminal connected to the base connection through the resistor 30 and the choke coil 21. The base connection 19 is slightly negative with respect to ground because of the flow of current from the emitter connection 17 through the body 11 of semiconductive material to the base connection 19 and from the latter back through the relatively high resistance current-limiting resistor 30 to the negative terminal of the battery. Since the negative terminal of the battery 20 is directly connected through coils 33 and 23 to the collector connection 18, the latter connection is more negative than the base connection and there is developed a reverse-direction bias between the collector and base connections 18 and 19 which affects the space-charge layer or region at the vicinity of the junctions of the portions 13 and 14 and develops an internal capacitance in that region. This capacitance is represented by the condenser $C_c$ in the equivalent circuit diagram of Fig. 2. The dielectric constant of the condenser $C_c$ is equal to that of the semiconductive material or germanium. The magnitude of the collector-base bias as developed by the battery 20 and as modified by the modulating signal applied to the emitter and base connections by the generator 22 may be considered physically to control the dimensions of the space-charge region mentioned above. An increase in the reverse-direction bias increases the dimensions or thickness of the space-charge region and produces the effect of a condenser having an increase in the spacing between electrodes corresponding to the increase in the thickness of that space-charge layer or region. Thus an increase in the reverse-direction bias results in a decrease in the capacitance $C_c$. Conversely a decrease in such a bias decreases the dimensions of the space-charge region and increases the capacitance of the condenser corresponding to the space-charge region. The condenser or capacitance $C_c$ existing at the junctions of the portions 14 and 13 is shunted by an internal resistance $R_c$ which, because of the reverse-direction bias, has a high value that has been found to be of the order of 100–5000 kilohms. Since the resistance $R_c$ will ordinarily be at least one order of magnitude greater than the reactance of $C_c$ to the modulating signal supplied by generator 22, resistance $R_c$ will not tend to load down the tuned circuit 28.

Figure 2:
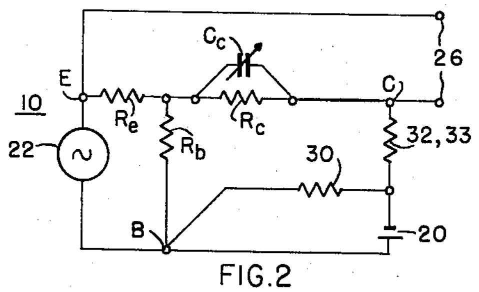
Fig. 2 is an equivalent circuit diagram of the transistor reactance device of Fig. 1.

The semiconductive body 11 of Fig. 1 also includes an internal emitter resistance which may be represented by the resistor $R_e$ of Fig. 2 and includes an internal base resistance represented by the resistor $R_b$. The terminals of the equivalent circuit of Fig. 2 designated by the reference characters E, B, and C represent, respectively, the emitter, base, and collector electrodes of the transistor. From Fig. 2 it will be seen that the circuit between the collector and emitter terminals C and E of the semiconductive body 11 of Fig. 1 may be regarded as an equivalent resistor-condenser network comprising the resistor $R_e$ in series with the parallel combination of the resistor $R_c$ and the condenser $C_c$. It has been determined that, for certain types of junction transistors, the magnitude of the capacitive component $C_c$ (expressed in farads) of this network may be represented as a constant times an inverse fractional power of the collector voltage, this constant being of the order of $75\times10^{-12}$ and the fractional power being approximately between 1/3 and 1/2 depending somewhat on the transistor being employed. Since the resistance $R_c$ is high, as previously stated, the network $R_c$, $C_c$ is substantially a pure capacitance. The resistive component of the circuit between the emitter and collector terminals E and C is approximately equal to the internal emitter resistance $R_e$ and is inversely proportional to the emitter current. As previously stated, the parameters of the transistor device 10 are selected so that the emitter current is high resulting in a small value of $R_e$ which, for some applications, has been found to be of the order of 10–50 ohms. The required change in emitter current, and thus the collector current, to produce a given change in collector voltage is held small by employing in the collector circuit a network 32, 33 having a high impedance to a control signal supplied by the generator 22 in order to reduce the variations in $R_e$ which will, in turn, reduce undesired amplitude modulation. The base internal resistance $R_b$ may be of the order of 300–1000 ohms. It has been determined that a relatively high Q capacitive reactance is developed between the collector and emitter connections 18 and 17, and this capacitance is lightly coupled across the tuned circuit 28 by the condenser 27.

The quiescent frequency of the oscillator 29 is determined in part by the collector capacitance $C_c$ which, in turn, is a function of the quiescent collector-base reverse-bias voltage. The application of a control signal by the generator 22 between the emitter and base connections 17 and 19 of the transistor reactance device 10 causes an amplified version of that signal to appear between the collector and base electrodes. This, in turn, varies the magnitude of the reverse-direction bias on the last-mentioned electrodes of the transistor device 10 and simultaneously varies the magnitude of the capacitance $C_c$. When the control signal is a periodic voltage such as an audio-frequency signal which develops a variation in the collector voltage that is small with reference to its quiescent or bias voltage, there is developed at the junctions of the portions 14 and 13 a variation of the capacitance $C_c$ which is a linear function of the magnitude of that control voltage. This capacitance is coupled by the coupling condenser 27 of Fig. 1 and the emitter connection 17 across the tuned circuit 28 of the oscillator 29 and is effective in the well-known manner to modify the resonant frequency of the oscillator, thereby producing a frequency-modulated output signal at the output terminals of the oscillator. The radio-frequency choke coil 23 presents a high impedance to ground to signals of the frequency of the oscillator 29 and, because of the choke coil 21, the base electrode of the transistor is effectively open-circuited to such signals. It has been determined in some applications of the device 10 that the condenser $C_c$ effectively at the junctions of the portions 14 and 13 may have a change of capacitance of the order of 25–60 micromicrofarads for a collector voltage change of about 10 volts. This represents a large variation in the collector-to-base capacitance of the transistor when that variation is considered in terms of the magnitude of the variation of the control voltage applied between the emitter and base connections necessary to effect this change. An R. M. S. voltage variation of about 1.2 millivolts in the signal applied between the emitter and base connections has been found in some applications to produce a frequency deviation of about 30 kilocycles in the oscillator 29 when the latter is operating at a frequency of about 40 megacycles, thus indicating a very high sensitivity. This high sensitivity results because of the amplification afforded by the transistor to the applied modulating signal. In frequency modulators of the type described above, undesirable amplitude modulation of the developed frequency-modulated output signal has proven to be extremely small, that is less than 0.1 percent, when the direct-current or quiescent value of the emitter current is high and the alternating current swing or variation thereof effected by the modulating signal is small.

For some applications wherein the stability of the mean operating frequency of the oscillator 29 is not important or wherein it is important but may be controlled by an automatic-frequency-control system, the audio-frequency choke coil 33 may be omitted between the radio-frequency choke coil 23 and the negative terminal of the battery 20 for reasons which will be made clear hereinafter. Since the audio-frequency choke has a very high impedance to signals of audio frequency, it assures a high gain for the signal applied to the input terminals 34, 34. However, it also maintains the quiescent voltage of the collector at the potential of the battery 20, thus tending to stabilize the quiescent collector voltage against variations in temperature and variations in transistor characteristics due to aging or other causes. This may be important in some applications since variations in the quiescent collector voltage will undesirably shift the quiescent frequency of the oscillator 29. If a resistor were employed in lieu of the choke coil 33, variations of current flow during quiescent conditions through the resistor as a result of aging, temperature changes, etc. will alter the quiescent collector voltage with respect to that of the battery 20, thus changing the frequency of the oscillator 29. Accordingly, the audio-frequency choke coil 33 may be said to perform the stabilizing function of minimizing oscillator drift, which function may be important when relatively high stability is required and the oscillator is not coupled to a conventional automatic-frequency-control system.

The direct-current power required to operate the transistor reactance device is quite small. The device 10, therefore, features high sensitivity because of the voltage gain afforded to an applied control signal, low power consumption, and the capability of developing a controllable capacitance for application to a tuned circuit which may be resonant at a frequency in a very high frequency range considerably above the highest at which a transistor is capable of translating an applied signal.

Figure 3:
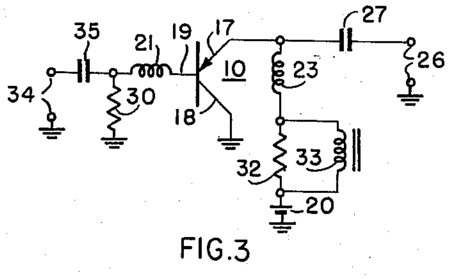
Fig. 3 is a circuit diagram of a transistor reactance device in accordance with a modified form of the invention.

*Description of transistor reactance device of Fig. 3*

Referring now to Fig. 3 of the drawing, there is represented a transistor reactance device which is generally similar to that represented in Fig. 1. Accordingly, corresponding elements are designated by the same reference numerals. The device of Fig. 3 differs from that of Fig. 1 in that the collector connection 18 is grounded, the input signal is applied between the base and collector connections, and the output signal is taken from the emitter connection 17 through the coupling condenser 27 coupled to the output terminals 26, 26. When the transistor is connected in circuit as represented, no voltage gain is afforded to the applied control voltage which is impressed between the grounded collector connection 18 and the base connection 19. However, this reactance device offers the advantage of a very high input impedance which is desirable in some applications such as in automatic-frequency-control systems. But for the lack of voltage gain, the operation of the transistor reactance device 10 of Fig. 3 is substantially the same as that of the Fig. 1 device and, hence, will not be repeated.

Figure 4:
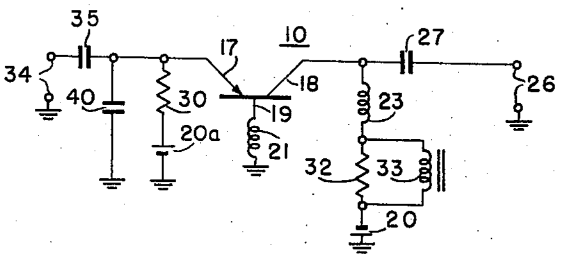
Fig. 4 is a circuit diagram of another modification of a transistor reactance device in accordance with the present invention.

*Description of transistor reactance device of Fig. 4*

Fig. 4 is a circuit diagram of a transistor reactance device which is generally similar to the device 10 of Fig. 1. Accordingly, corresponding elements in the Fig. 4 circuit are designated by the same reference numerals employed in Fig. 1. The condenser 40 coupled between the emitter connection 17 and ground is a radio-frequency by-pass condenser. The circuit of Fig. 4 applies the control signal between the emitter connection 17 and the base connection 19, the latter being connected to ground through the radio-frequency choke coil 21. Output signals are derived across the collector and emitter connections by the coupling condenser 27 connected to output terminals 26, 26. The transistor reactance device 10 of Fig. 4 is effective to amplify the applied control signal and its operation is generally similar to the circuit of Fig. 1 and, therefore, will not be repeated.

While applicant does not wish to be limited to any particular set of circuit constants, the following constants have proven to be useful in a transistor reactance modulator system of the type represented in Fig. 1:

| | |
|---|---|
| Transistor **10** | Raytheon type CK-721. |
| Resistor **30** | 100 kilohms. |
| Resistor **32** | 30 kilohms. |
| Condenser **27** | 4.7 micromicrofarads. |
| Condenser **35** | 1 microfarad. |
| Condenser **40** | 50 micromicrofarads. |
| Choke coils **21, 23** | 50 microhenries. |
| Choke coil **33** | 2.5 henries. |
| Battery **20** | 7 volts. |
| R. M. S. voltage of source **22** | 1.2 millivolts. |
| Mean frequency of oscillator **29** | About 40 megacycles. |
| Frequency deviation | 0–25 kilocycles. |
| Power consumption | About 14 milliwatts. |

Where there have been described what are at present considered to be the preferred embodiments of this invention, it will be obvious to those skilled in the art that various changes and modifications may be made therein without departing from the invention, and it is, therefore, aimed to cover all such changes and modfications as fall within the true spirit and scope of the invention.

What is claimed is:

1. A transistor reactance device operative to develop a controllable reactance over a wide range of frequencies which may be above the signal-amplification frequency range of a transistor comprising: a body having two portions separated by an intermediate portion of semiconductive material presenting a space-charge region about the junctions of said portions; emitter and collector connections to said two portions and a base connection to said intermediate portion; circuit means including means having a very high impedance to signals in said first mentioned range for supplying a bias voltage in the forward direction between said emitter and base connections and including means having a very high impedance to signals in said first-mentioned range for applying a bias voltage in the reverse direction between said collector and base connections whereby said body has a reactance at the junction of said portions between said collector and base connections; means for applying a control voltage between at least one of said emitter and collector connections and said base connection to develop between said collector and base connections a variation of said reactance related to the magnitude of said control voltage; and output circuit means coupled to said collector and emitter connections.

2. A transistor reactance device operative to develop a controllable reactance over a wide range of frequencies which may be above the signal-amplification frequency range of a transistor comprising: a body having two portions of semiconductive material of one conductivity type separated by an intermediate portion of semiconductive material of the opposite type presenting a space-charge region about the junctions of said portions; emitter and collector connections to said two portions and a base connection to said intermediate portion; circuit means including means having a very high impedance to signals in said first-mentioned range for supplying a bias voltage in the forward direction between said emitter and base connections and including means having a very high impedance to signals in said first-mentioned range for applying a bias voltage in the reverse direction between said collector and base connections whereby said body has a reactance at the junction of said portions between said collector and base connections; means for applying a control voltage between at least one of said emitter and collector connections and said base connection to develop between said collector and base connections, without appreciably varying the $\alpha$ cutoff frequency of said transistor, a substantial variation of said reactance related to the magnitude of said control voltage; and output circuit means coupled to said collector and emitter connections.

3. A transistor reactance device operative to develop a controllable capacitance over a wide range of frequencies which may be above the signal-amplification frequency range of a transistor comprising: a body having two portions separated by an intermediate portion of semiconductive material presenting a space-charge region about the junctions of said portions; emitter and collector connections to said two portions and a base connection to said intermediate portion; circuit means including a first radio-frequency choke coil for supplying a bias voltage in the forward direction between said emitter and base connections and including a second radio-frequency choke coil for applying a bias voltage in the reverse direction between said collector and base connections whereby said body has a capacitance at the junction of said portions between said collector and base connections; means for applying a control voltage between at least one of said emitter and collector connections and said base connection to develop between said collector and base connections a variation of said capacitance related to the magnitude of said control voltage; and output circuit means coupled to said collector and emitter connections.

4. A transistor reactance device operative to develop a controllable reactance over a wide range of frequencies above the signal-amplification frequency range of a transistor comprising: a body having two portions separated by an intermediate portion of semiconductive material presenting a space-charge region about the junctions of said portions; emitter and collector connections to said two portions and a base connection to said intermediate portion; circuit means including means having a very high impedance to signals in said first-mentioned range for supplying a bias voltage in the forward direction between said emitter and base connections and including means having a very high impedance to signals in said first-mentioned range for applying a bias voltage in the reverse direction between said collector and base connections whereby said body has a reactance at the junction of said portions between said collector and base connections; means for applying a control voltage between at least one of said emitter and collector connections and said base connection to develop between said collector and base connections a variation of said reactance related to the magnitude of said control voltage; and output circuit means, including a tuned circuit resonant at a frequency above said signal-amplification range and responsive to said reactance variation, coupled to said collector and emitter connections.

5. A transistor reactance device operative to develop a controllable reactance over a wide range of frequencies above the signal-amplification frequency range of a transistor comprising: a body having two portions separated by an intermediate portion of semiconductive material presenting a space-charge region about the junctions of said portions; emitter and collector connections to said two portions and a base connection to said intermediate portion; circuit means including a first radio-frequency choke coil for supplying a bias voltage in the forward direction between said emitter and base connections and including a second radio-frequency choke coil for applying a bias voltage in the reverse direction between said collector and base connections whereby said body has a reactance at the junction of said portions between said collector and base connections; means for applying a control voltage between at least one of said emitter and collector connections and said base connection to develop between said collector and base connections a variation of said reactance related to the magnitude of said control voltage; and output circuit means, including an oscillator having a tuned circuit resonant at a frequency above said signal-amplification range and responsive to said reactance variation, coupled to said collector and emitter connections.

6. A transistor reactance device operative to develop a controllable reactance over a wide range of frequencies which may be above the signal-amplification frequency range of a transistor comprising: a body having two portions separated by an intermediate portion of semiconductive material presenting a space-charge region about the junctions of said portions; emitter and collector connections to said two portions and a base connection to said intermediate portion; circuit means including a second radio-frequency choke coil for supplying a bias voltage in the forward direction between said emitter and base connections and including a second radio-frequency choke coil and audio-frequency choke coil for applying a bias voltage in the reverse direction between said collector and base connections whereby said body has a reactance at the junction of said portions between said collector and base connections; means for applying between at least one of said emitter and collector connections and said base connection a periodic audio-frequency control voltage having an amplitude less than the magnitude of said reverse bias voltage to develop between said collector and base connections a variation of said reactance which is a linear function of the magnitude of said control voltage; and output circuit means coupled to said collector and emitter connections.

7. A transistor reactance device operative to develop a controllable reactance over a wide range of frequencies which may be above the signal-amplification frequency range of a transistor comprising: a body having two portions separated by an intermediate portion of semiconductive material presenting a space-charge region about the junctions of said portions; emitter and collector connections to said two portions and a base connection to said intermediate portion; circuit means including a first radio-frequency choke coil for supplying a bias voltage in the forward direction between said emitter and base connections and including a second radio-frequency choke coil and an audio-frequency choke coil for applying a bias voltage in the reverse direction between said collector and base connections whereby said body has a reactance at the junction of said portions between said collector and base connections; means for applying a control voltage between said emitter and base connections to develop between said collector and emitter connections a voltage representative of and having a magnitude greater than that of said control voltage and a variation of said reactance related to the magnitude of said control voltage; and output circuit means coupled to said collector and emitter connections.

8. A transistor reactance device operative to develop a controllable reactance over a wide range of frequencies which may be above the signal-amplification frequency range of a transistor comprising: a body having two portions separated by an intermediate portion of semiconductive material presenting a space-charge region about the junctions of said portions; emitter and collector connections to said two portions and a base connection to said intermediate portion; circuit means including a first radio-frequency choke coil and an audio-frequency choke coil for supplying a bias voltage in the forward direction between said emitter and base connections and including a second radio-frequency choke coil for applying a bias voltage in the reverse direction between said collector and base connections whereby said body has a reactance at the junction of said portions between said collector and base connections; means for applying a control voltage between said collector and base connections to develop between said emitter and collector connections a variation of said reactance related to the magnitude of said control voltage; and output circuit means coupled to said collector and emitter connections.

9. A transistor reactance device operative to develop a controllable reactance over a wide range of frequencies which may be above the signal-amplification frequency range of a transistor comprising: a body having two portions separated by an intermediate portion of semiconductive material presenting a space-charge region about the junctions of said portions; emitter and collector connections to said two portions and a base connection to said intermediate portion, said emitter connection being connected to a point of fixed potential; circuit means including a first radio-frequency choke coil for supplying a bias voltage in the forward direction between said emitter and base connections and including a second radio-frequency choke coil and an audio-frequency choke coil for applying a bias voltage in the reverse direction between said collector and base connections whereby said body has a reactance at the junction of said portions between said collector and base connections; means for applying a control voltage between said emitter and base connections to develop between said collector and base connections a voltage representative of and having a magnitude greater than that of said control voltage and a variation of said reactance related to the magnitude of said control voltage; and output circuit means coupled to said collector and emitter connections.

10. A frequency-modulation system operative over a range of frequencies above the signal-amplification frequency range of a transistor comprising: a body having two portions separated by an intermediate portion of semiconductive material presenting a space-charge region about the junctions of said portions; emitter and collector connections to said two portions and a base connection to said intermediate portion; circuit means including means having a very high impedance at frequencies in the first-mentioned range for supplying a bias voltage in the forward direction between said emitter and base connections and including means having a very high impedance at frequencies in said first-mentioned range and means having a high impedance at the frequency of a modulating signal in said signal-amplification range for applying a bias voltage in the reverse direction between said collector and base connections whereby said body has a reactance at the junction of said portions between said collector and base connections; a tuned circuit resonant within said first-mentioned range and coupled to said collector and emitter connections; and means for applying said modulating signal between said emitter and base connections to develop between said collector and base connections a voltage representative of and having a magnitude greater than that of said modulating signal and a variation of said reactance related to the magnitude of said control voltage, thereby to vary the resonant frequency of said tuned circuit.

11. A frequency-modulation system operative over a range of frequencies above the signal-amplification frequency range of a transistor comprising: a body having two portions separated by an intermediate portion of semi-conductive material presenting a space-charge region about the junctions of said portions; emitter and collector connections to said two portions and a base connection to said intermediate portion; circuit means including means having a first radio-frequency choke coil for supplying a bias voltage in the forward direction between said emitter and base connections and including a second radio-frequency choke coil and an audio-frequency choke coil for applying a bias voltage in the reverse direction between said collector and base connections whereby said body has a reactance at the junction of said portions between said collector and base connections; a tuned circuit resonant within said first-mentioned range and coupled to said collector and emitter connections; and means for applying an audio-frequency modulating signal between said emitter and base connections to develop between said collector and base connections a voltage representative of and having a magnitude greater than that of said modulating signal and a variation of said reactance related to the magnitude of said control voltage, thereby to vary the resonant frequency of said tuned circuit.

12. A frequency-modulation system operative over a range of frequencies above the signal-amplification frequency range of a transistor comprising: a body having two portions separated by an intermediate portion of semiconductive material presenting a space-charge region about the junctions of said portions; emitter and collector connections to said two portions and a base connection to said intermediate portion; circuit means including a voltage source, a resistor, and a radio-frequency choke coil serially connected between said emitter and base connections for supplying a bias voltage in the forward direction therebetween and circuit means including said source, means having a high impedance at the frequency of a modulating signal in said signal-amplification range and a radio-frequency choke coil serially connected between said emitter and collector connections for applying a bias voltage in the reverse direction between said collector and base connections whereby said body has a reactance at the junction of said portions between said collector and base connections; a tuned circuit resonant within said first-mentioned range and coupled to said collector and emitter connections; and means for applying said modulating signal between said emitter and base connections to develop between said collector and base connections a voltage representative of said modulating signal and a variation of said reactance related to the magnitude of said control voltage for varying the frequency of said tuned circuit.

13. A frequency-modulation system operative over a range of frequencies above the signal-amplification frequency range of a transistor comprising: a body having two portions separated by an intermediate portion of semiconductive material presenting a space-charge region about the junctions of said portions; emitter and collector connections to said two portions and a base connection to said intermediate portion; circuit means including a resistor, a first voltage source, and a first radio-frequency choke coil serially connected between said emitter and base connections for supplying a bias voltage in the forward direction therebetween and circuit means including a radio-frequency choke coil, means having a high impedance at the frequency of a modulating signal in said signal-amplification range, a second voltage source, and said first choke coil serially connected between said emitter and collector connections for applying a bias voltage in the reverse direction between said collector and base connections whereby said body has a reactance at the junction of said portions between said collector and base connections; a tuned circuit resonant within said first-mentioned range and coupled to said collector and emitter connections; and means for applying said modulating signal between said emitter and base connections to develop between said collector and base connections a voltage representative of and having a magnitude greater than that of said modulating signal and a variation of said reactance related to the magnitude of said control voltage for varying the frequency of said tuned circuit.

14. A transistor reactance device operative to develop a controllable reactance over a wide range of radio frequencies which may be above the signal-amplification frequency range of a transistor comprising: a body having two portions separated by an intermediate portion of semi-conductive material presenting a space-charge region about the junctions of said portions; emitter and collector connections to said two portions and a base connection to said intermediate portion; circuit means including a voltage source, a resistor, and a radio-frequency choke coil serially connected between said emitter and base connections for supplying a bias voltage in the forward direction therebetween and circuit means including said source, an audio-frequency choke coil, and a radio-frequency choke coil for applying a bias voltage in the reverse direction between said collector and base connections whereby said body has a reactance at the junction of said portions between said collector and base connections; means for applying a control voltage between said emitter and base connections to develop between said collector and base connections a voltage representative of and having a magnitude greater than that of said control voltage and a variation of said reactance related to the magnitude of said control voltage; and output circuit means coupled to said collector and emitter connections.

15. A frequency-modulation system operative over a range of frequencies above the signal-amplification frequency range of a transistor comprising: a body having two portions separated by an intermediate portion of semiconductive material presenting a space-charge region about the junctions of said portions; emitter and collector connections to said two portions and a base connection to said intermediate portion; circuit means including means having a very high impedance at frequencies in said wide range for supplying a bias voltage in the forward direction between said emitter and base connections and including means having a very high impedance at frequencies in said first-mentioned range and means having a high impedance at the frequency of a modulating signal in said signal-amplification range for applying a bias voltage in the reverse direction between said collector and base connections whereby said body has a reactance at the junction of said portions between said collector and base connections; a tuned circuit resonant within said first-mentioned range and coupled to said collector and emitter connections; and means for applying said modulating signal with a maximum amplitude about 0.02 percent that of said forward-direction bias voltage between said emitter and base connections to develop between said collector and base connections a voltage representative of and having a magnitude greater than that of said modulating signal and a variation of said reactance related to the magnitude of said control voltage, thereby to vary the resonant frequency of said tuned circuit.

References Cited in the file of this patent

UNITED STATES PATENTS

| | | |
|---|---|---|
| 2,569,347 | Schockley | Sept. 25, 1951 |
| 2,570,939 | Goodrich | Oct. 9, 1951 |
| 2,744,970 | Schockley | May 8, 1956 |
| 2,771,584 | Thomas | Nov. 20, 1956 |